United States Patent
Chen et al.

(10) Patent No.: US 12,294,011 B2
(45) Date of Patent: May 6, 2025

(54) IMAGE SENSOR PIXEL WITH DEEP TRENCH ISOLATION STRUCTURE

(71) Applicant: MAGVISION SEMICONDUCTOR (BEIJING) INC., Beijing (CN)

(72) Inventors: Gang Chen, San Jose, CA (US); Yi Zhang, Shanghai (CN); Fengyun Yan, Beijing (CN)

(73) Assignee: MAGVISION SEMICONDUCTOR (BEIJING) INC., Beijing (CN)

( * ) Notice: Subject to any disclaimer, the term of this patent is extended or adjusted under 35 U.S.C. 154(b) by 490 days.

(21) Appl. No.: 17/459,039

(22) Filed: Aug. 27, 2021

(65) Prior Publication Data

US 2023/0029874 A1 Feb. 2, 2023

Related U.S. Application Data

(60) Provisional application No. 63/226,509, filed on Jul. 28, 2021.

(51) Int. Cl.
*H01L 27/146* (2006.01)

(52) U.S. Cl.
CPC .... *H01L 27/1463* (2013.01); *H01L 27/14603* (2013.01); *H01L 27/14614* (2013.01); *H01L 27/1464* (2013.01); *H01L 27/14641* (2013.01); *H01L 27/14636* (2013.01)

(58) Field of Classification Search
CPC ......... H01L 27/14614; H01L 27/14603; H01L 27/14605; H01L 27/1463; H01L 27/1464; H01L 27/14636; H01L 27/14641; H01L 27/14612–14616
See application file for complete search history.

(56) References Cited

U.S. PATENT DOCUMENTS

| | | | |
|---|---|---|---|
| 7,075,049 B2 | 7/2006 | Rhodes et al. | |
| 8,633,431 B2 | 1/2014 | Kim | |
| 10,559,614 B2 | 2/2020 | Oh | |
| 11,405,575 B2 | 8/2022 | Bairo | |
| 2004/0141077 A1* | 7/2004 | Ohkawa | H01L 27/14623 348/E3.018 |
| 2005/0151175 A1* | 7/2005 | Ohkawa | H01L 27/14601 257/292 |
| 2013/0050552 A1* | 2/2013 | Oishi | H01L 27/14616 257/292 |
| 2016/0043132 A1 | 2/2016 | Ihara | |
| 2020/0083266 A1 | 3/2020 | Nakadate et al. | |
| 2020/0350355 A1* | 11/2020 | Raynor | H01L 27/14603 |
| 2021/0074747 A1* | 3/2021 | Takahashi | H01L 27/1463 |

FOREIGN PATENT DOCUMENTS

CN 111415951 A 7/2020

* cited by examiner

*Primary Examiner* — Yu Chen
(74) *Attorney, Agent, or Firm* — HAYNES AND BOONE, LLP

(57) ABSTRACT

An image sensor device is disclosed. The image sensor device includes a substrate having a plurality of pixel regions. The image sensor device also includes a first photodiode in a first pixel region, a source follower transistor coupled to the first photodiode, and a select transistor coupled to the source follower transistor. One of the source follower transistor and the select transistor is in a second pixel region that is different from the first pixel region. While the source follower and the select transistor can be allocated to different cells, either the source follower or the select transistor or both can be further allocated or split into different cells.

24 Claims, 15 Drawing Sheets

IMAGE SENSOR PIXEL WITH DEEP TRENCH ISOLATION STRUCTURE

PRIORITY DATA

This application claims priority to U.S. Provisional Patent Application Ser. No. 63/226,509, filed on Jul. 28, 2021, the entire disclosure of which is incorporated herein by reference.

BACKGROUND

The applications of image sensors have become ubiquitous. An image sensor may include an array of pixels arranged in two dimensions. Each of the pixels includes a photodiode, or other suitable photoelectric element, and a microlens. The microlens focuses light onto the photodiode, and the photodiode converts the light into electric signals. The electric signals are output from the image sensor to other components of a host electronic device, such as a digital camera, a mobile phone, a computer, a security camera, an automotive product, a medical accessory, or other electronic device, to form an image.

The semiconductor integrated circuit (IC) industry has experienced exponential growth. Technological advances in IC materials and design have produced generations of ICs where each generation has smaller and more complex circuits than the previous generation. The technologies used to manufacture image sensors, such as complementary metal oxide semiconductor (CMOS) image sensor technology, have continued to advance too. The demands for higher resolution and lower power consumption have driven the trend of further miniaturization and integration of image sensors. The corresponding pixels in image sensors are therefore scaled down. This scaling down process generally provides benefits by increasing production efficiency and lowering associated costs. Such scaling down has also increased the complexity of processing and manufacturing. For example, as the sizes of pixels continue to decrease, cross-talk and interference among pixels may occur more often. Deep trench isolation (DTI) structures have been proposed to isolate pixels one from another. Although DTI structures suppress cross-talk and interference among pixels, as the pixel pitch moves into sub-0.8 µm (micron) scale, DTI structures conversely limit pixel regions available for forming transistors in a pixel, which compromises transistor performance as a tradeoff for reduced pixel sizes. Therefore, although conventional means of designing image sensors have been generally adequate for their intended purposes, they are not satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
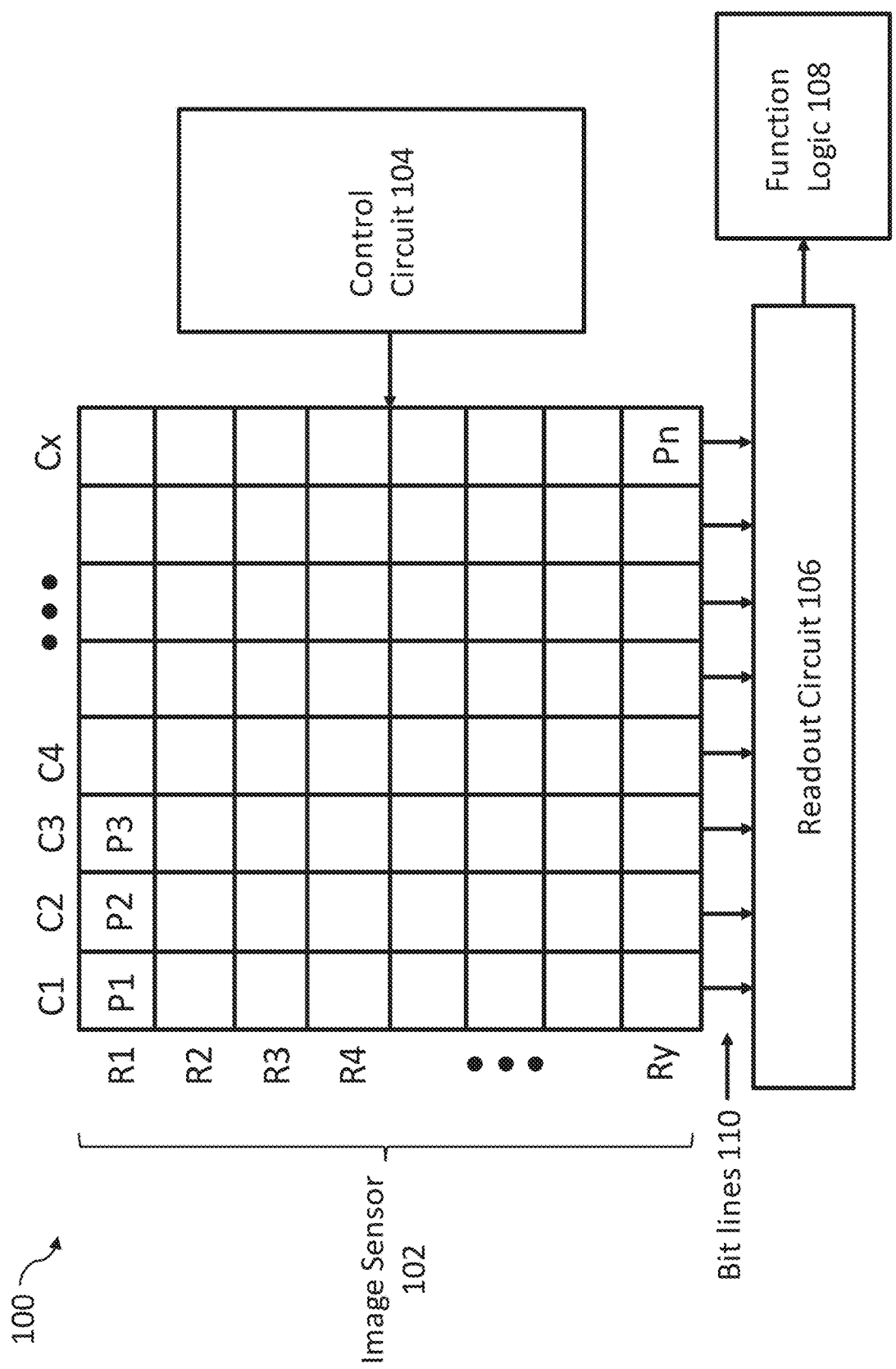
FIG. 1 is a diagram illustrating an imaging system including an image sensor formed of a pixel array according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure is generally related to image sensors. More particularly, some embodiments are related to complementary metal oxide semiconductor (CMOS) image sensors with a deep trench isolation (DTI) structure defining an array of pixel regions for components of pixels to reside therein. Each of the pixels includes a photodiode (PD) and several transistors associated with the photodiode that are bounded by walls of the DTI structure. It is an objective of the present disclosure to provide image sensor designs where design rules of the transistors—such as shapes and sizes of active regions, gate length, gate width, and process parameters—are not limited by the DTI structure when the pixels are continuously downscaled.

DTI structures, such as BDTI (back-side DTI) and FDTI (front-side DTI, or referred to as full-depth DTI), have been picked as a promising approach for isolation among pixels of CMOS image sensors. Generally, a DTI structure defines cells with unit size. Each cell provides a pixel region to allocate components of a pixel. However, the aggressive pace of downscaling leaves smaller and smaller pixel region to host transistors inside walls of a DTI structure, resulting in degraded circuit performance including increased leakage, unstable threshold voltages, and reduced gate drive capabilities. Accordingly, there is a need to keep sufficient transistor dimensions and flexibility of design choices with the smaller pixel region footprints, which is in turn pertinent to maintaining and improving pixel performance.

In various embodiments of the present disclosure, transistors associated with the same photodiode may be allocated in more than one pixel region. In some embodiments, some transistors, such as source follower (SF) transistor and select transistor (e.g., row select transistor), are allocated in separate pixels and connected by contacts and metal wire routings. Such arrangement not only allows dimensions (e.g., gate length, gate width, etc.) of each transistor to be optimized individually but also allows process parameters (e.g., doping concentrations, gate oxide thickness, etc.) for each transistor to be fine-tuned separately, providing more circuit design flexibility and higher pixel performance.

FIG. 1 illustrates a diagram illustrating an exemplary imaging system 100 including an image sensor 102 having pixels with a DTI structure in accordance with various aspects of the present disclosure. As shown in the depicted example, the imaging system 100 includes the image sensor 102 coupled to a control circuit 104 and a readout circuit 106. The imaging system 100 also include a function logic 108 coupled to the readout circuit 106.

Figure 2:
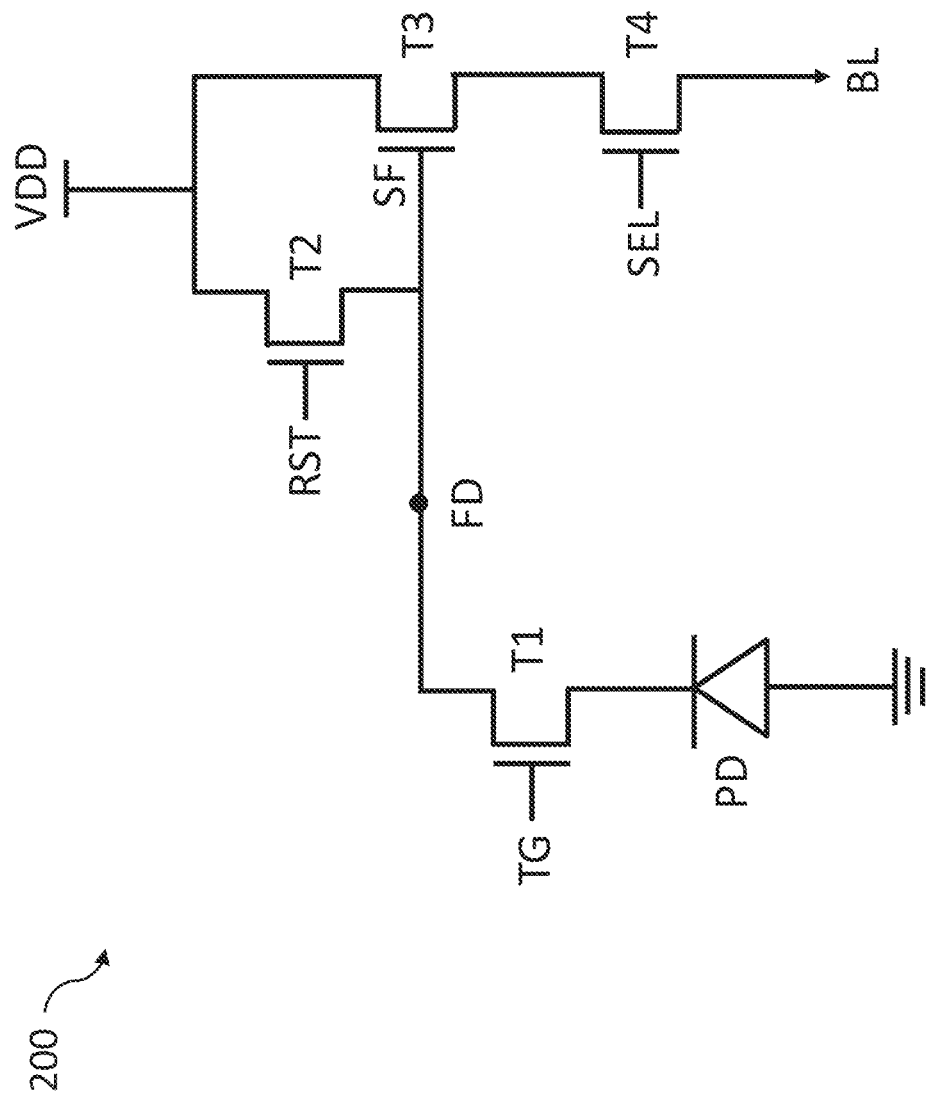
FIG. 2 is a schematic illustrating a pixel that may be included in a pixel array according to various aspects of the present disclosure.

In the illustrated embodiment, the image sensor 102 includes a pixel array that is a two-dimensional (2D) array of pixels (e.g., pixels P1, P2, . . . Pn). In one example, each pixel is a CMOS imaging pixel. It is noted that each pixel P1, P2, . . . Pn in the pixel array may be similar to an exemplary pixel 200 as shown in FIG. 2. As illustrated, the pixels are arranged into rows (e.g., rows R1 to Ry) and columns (e.g., columns C1 to Cx) to acquire incident light intensity, which can then be used to render an image.

In an example, after each pixel has accumulated its image data (or photo charges), the image data is read out by the readout circuitry 106 through bit lines 110 and then transferred to the function logic 108. In various examples, the readout circuit 106 may include amplification circuits, analog-to-digital (ADC) conversion circuits, or other suitable circuits. The function logic 108 may store the image data or even manipulate the image data by applying post image effects (e.g., cropping, rotation, brightness adjustment, contrast adjustment, etc.). In an example, the readout circuit 106 may read out a row of image data at a time along the bit lines 110 or may read out the image data using a variety of other techniques, such as a serial readout or a full parallel readout of all pixels simultaneously.

In an example, the control circuit 104 is coupled to the image sensor 102 to control operational characteristics of its pixel array. For example, the control circuitry 104 may generate a shutter signal for controlling image acquisition. In an example, the shutter signal is a global shutter signal for simultaneously enabling all pixels within the pixel array to simultaneously capture their respective image data during a single acquisition window. In another example, the shutter signal is a rolling shutter signal such that each row, column, or group of pixels are sequentially enabled during consecutive acquisition windows.

FIG. 2 illustrates a pixel 200 as an exemplary pixel in the pixel array of the image sensor 102 shown in FIG. 1. Similar elements appearing in the present disclosure are labeled the same and the details of these elements are not necessarily repeated for reasons of clarity and simplicity. In the depicted example, the pixel 200 is illustrated as being a four-transistor (4T) pixel. The illustrated pixel 200 is one possible example of pixel circuitry architecture for implementing each pixel within the pixel array of the image sensor 102 of FIG. 1. Other examples in accordance with the teachings of the present disclosure are possible and are not limited to a 4T pixel architecture. One having ordinary skill in the art having the benefit of the present disclosure will understand that the teachings of the present disclosure are also applicable to 3T pixel designs, 5T pixel designs, and various other pixel architectures. In an example and as will be discussed in further detail below, the pixel 200 is confined within walls of a deep trench isolation (DTI) structure for isolation from adjacent pixels. As such, reduced cross-talk and consequently higher circuit sensitivity is achieved.

The pixel 200 includes a photodiode (PD) to accumulate photo charges (or photocharges), a transfer transistor T1, a reset transistor T2, a floating diffusion region FD, a source follower (SF) transistor T3, and a select transistor T4. During operation, the gate TG of the transfer transistor T1 receives a transfer signal, which passes the photo charges accumulated in the photodiode PD to the floating diffusion region FD. In one example, the floating diffusion region FD may be coupled to a storage capacitor for temporarily storing photo charges. As shown in the illustrated embodiment, the reset transistor T2 is coupled between a power rail VDD and the floating diffusion FD to reset the pixel 200 (e.g., by discharging the floating diffusion region FD and setting the photodiode PD to a preset voltage) in response to a reset signal received by the gate RST of the reset transistor T2. The floating diffusion region FD is also coupled to control the gate SF of the source follower transistor T3. The source follower transistor T3 is coupled between the power rail VDD and the select transistor T4. The source follower transistor T3 operates as a source follower amplifier providing a high impedance connection to the floating diffusion region FD for buffering signals associated with the stored photo charges on the floating diffusion region FD. The select transistor T4 selectively couples the output of the pixel 200 to the bit line BL (e.g., the bit line 110 in FIG. 1) in response to the select signal received by the gate SEL of the select transistor T4. In one example, the bit line BL is a row bit line, and the select transistor T4 is a row select transistor.

In one example, signals applied to the gates of TG, RST, and SEL are generated by the control circuit 104. In an example in which the image sensor 102 operates with a global shutter, the global shutter signal is coupled to the gate of each transfer transistor T1 to simultaneously commence photo charge transfer from each associated photodiode PD. Alternatively, rolling shutter signals may be applied to groups of the transfer transistors T1.

Figure 3:
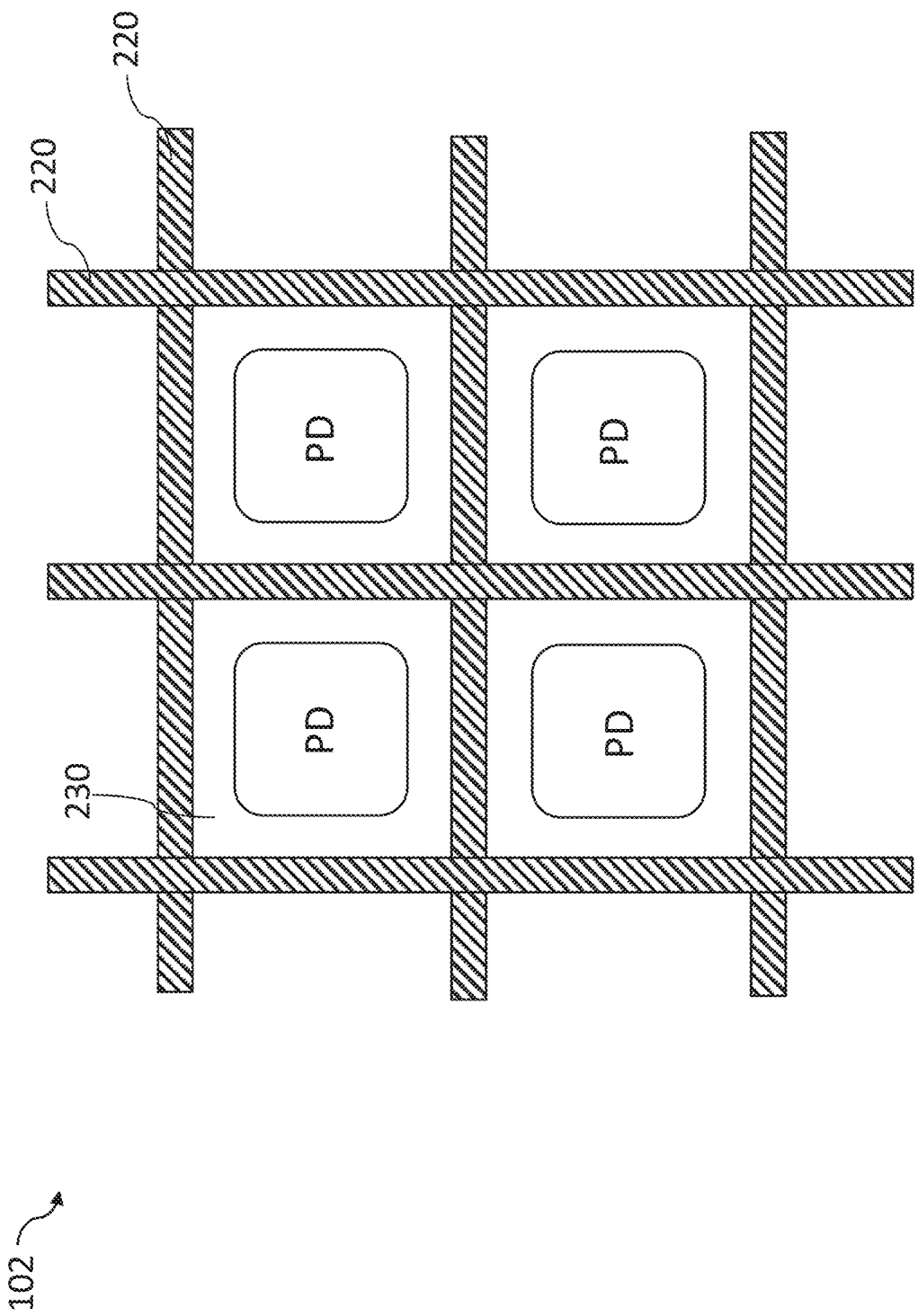
FIG. 3 is a top view of pixel regions in the form of cells defined by a deep trench isolation (DTI) structure according to various aspects of the present disclosure.

FIG. 3 illustrates a top view of a region of an array of cells defined by walls of a DTI structure 220. The depicted region is a 2×2 array. This example is given in a generic and descriptive sense only and not for purpose of limitation. The cells define pixel regions 230 in which components of the pixels 200 may reside. In the depicted embodiment, each pixel region 230 has a unit size (in other words, the pixel regions 230 have the same shapes and dimensions). The DTI structure 220 are disposed in a semiconductor substrate in which the photodiodes PD are formed and provides isolation to each photodiode PD from adjacent ones. In some embodiments, the DTI structure 220 also define an optical waveguide or an optical path for incident light to propagate through the semiconductor substrate to arrive at the photodiodes PD. Accordingly, each of the photodiodes PD is electrically and optically isolated by the DTI structure 220 from adjacent photodiodes.

Figure 4:
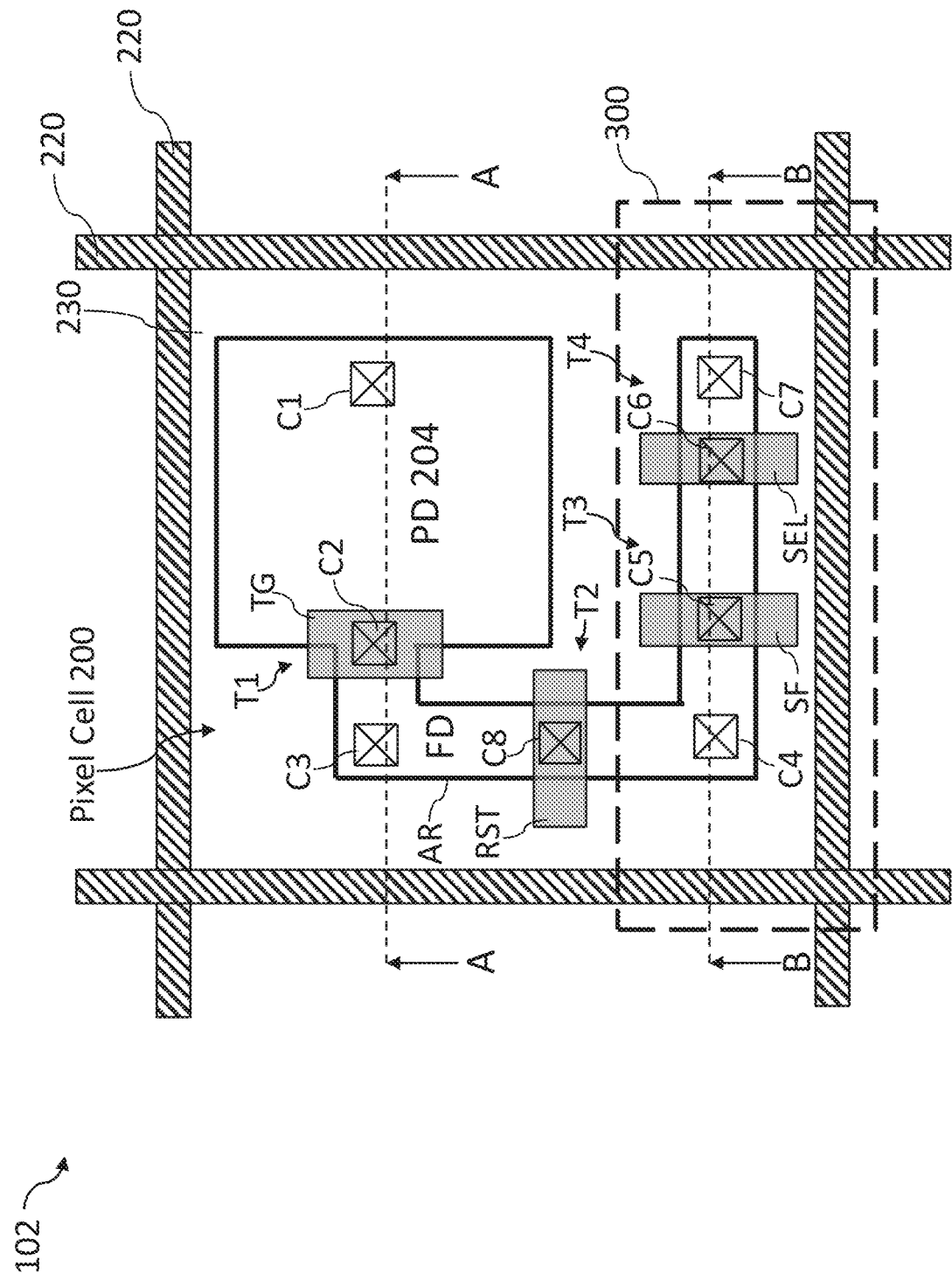
FIG. 4 is a top view of an exemplary layout of a pixel in a pixel region according to various aspects of the present disclosure.
Figure 5A:
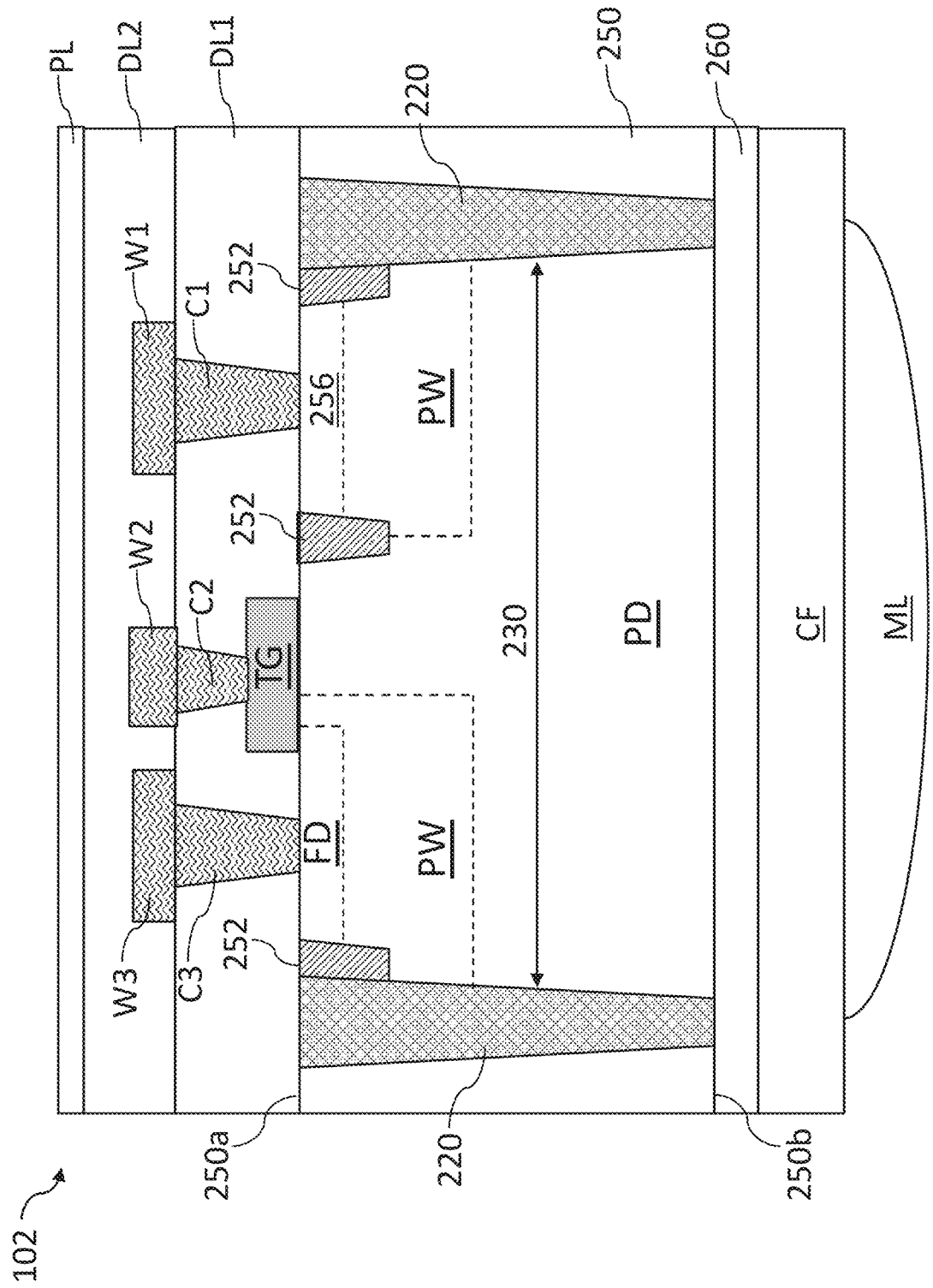
FIGS. 5A and 5B are cross-sectional views of the pixel region shown in FIG. 4 according to various aspects of the present disclosure.
Figure 5B:
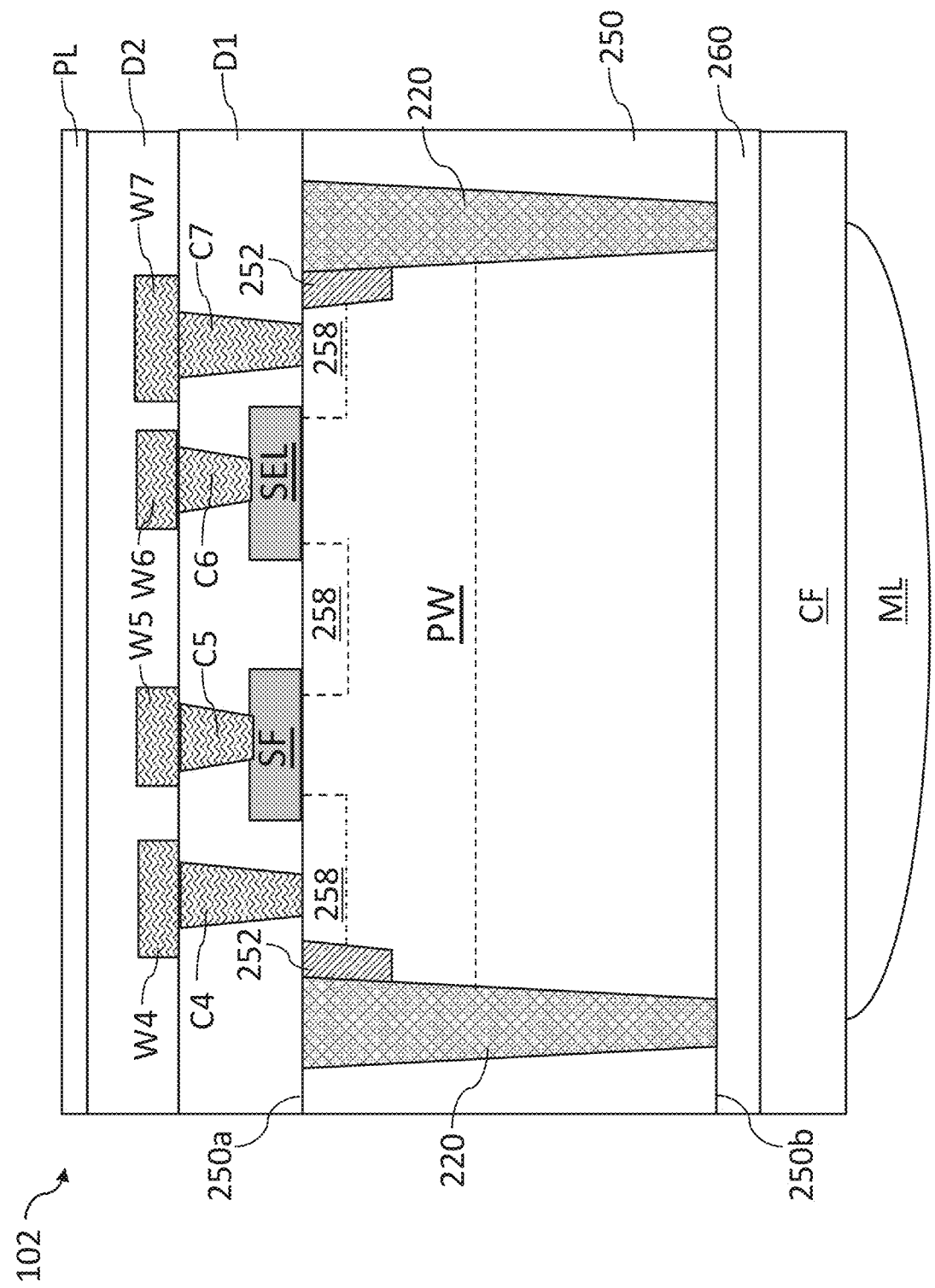

FIG. 4 is a layout illustrating a pixel 200 residing in a pixel region 230 defined by the DTI structure 220 in accordance with an embodiment. FIGS. 5A and 5B are sectional views taken along lines A-A and B-B of FIG. 4, respectively. FIGS. 5A and 5B only show one metal layer for illustration purpose only. Actual number of metal layers may be more than one depending on routing and other requirements.

Referring to FIGS. 4, 5A, and 5B collectively, a substrate 250 may be provided which includes the pixel regions 230 defined by the DTI structure 220. The substrate 250 may be a silicon wafer or a silicon-on-insulator (SOI) substrate, or a substrate including a semiconductor epitaxial layer. The substrate 250 is a silicon substrate in the illustrated embodiment. Alternatively, the substrate 250 may comprise another elemental semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 250 may be uniform in composition or may include various layers. The layers may have similar or different compositions, and in various embodiments, and some substrate layers may have non-uniform compositions to induce device strain for tuning device performance.

The substrate 250 includes a first surface 250a and a second surface 250b facing each other. The DTI structure 220 may be provided in the substrate 250 to separate the pixel regions 230 one from another. The DTI structure 220 may be formed at the edges of each of the pixel regions 230, such that each of the pixel regions 230 may be defined as a closed space surrounded by walls of the DTI structure 220 from a top view. The DTI structure 220 may be formed to have a height, which may be substantially equivalent to a thickness of the substrate 250. In the illustrated embodiment, the DTI structures 220 are formed fully through the substrate 250 to connect the first surface 250a and the second surface 250b to each other. Such a DTI structure is also referred to as a full-depth DTI (FDTI) structure. The FDTI structure is one possible example of isolation structures defining pixel regions 230. Other examples of isolation structures, such as a back-side DTI (BDTI) structure that generally does not extend completely through the substrate 250, may also be provided to define pixel regions 230 without departing from the teachings of the present disclosure.

The DTI structure 220 may be formed by filling an isolation trench with an insulating material or an insulating material sandwiching a conducting material. The insulating material may include silicon oxide, silicon nitride, silicon oxynitride, a low dielectric material having a lower dielectric constant than silicon oxide, or a combination thereof. The low-k dielectric material may include, but is not limited to, flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material or a combination thereof. In some embodiments, the dielectric material(s) of the DTI structure 220 provides a refractive index different from that of the substrate 250. For example, the DTI structures 220 may be formed of a silicon oxide layer. Alternatively, the DTI structures 220 may include multiple layers, such as an inner layer of a first dielectric material and an outer layer of a second dielectric material, to achieve a desired refractive index, such that the DTI structure 220 may function as an optical waveguide for incident lights. As a result, cross-talk may be prevented from occurring between the pixels adjacent to each other.

A plurality of transistors T1, T2, T3, and T4 and a plurality of metal wires may be provided on the first surface 250a. A light may be incident to the second surface 250b. The photodiode PD may be provided in the substrate 250. A well region PW may be provided in an upper portion of the photodiode PD near the first surface 250a. The well region PW may be doped to have a different or opposite conductivity type from a bottom portion of the photodiode PD near the second surface 250b. For example, the well region PW may be doped with p-type impurities, while the lower portion of the photodiode PD may be doped with n-type impurities.

Shallow device isolation layers (STI) 252 may be provided in the first surface 250a of the substrate 250 to define active regions AR of the transistors T1, T2, T3, and T4. The STI 252 may include silicon oxide, silicon nitride, silicon oxynitride, fluoride-doped silicate glass (FSG), a low-k dielectric material, and/or other suitable insulating material. In an embodiment, the STI 252 is formed by etching trenches in the substrate 250. The trenches may then be filled with isolating material, followed by a chemical mechanical planarization (CMP) process. Other isolation structure such as field oxide, LOCal Oxidation of Silicon (LOCOS), and/or other suitable structures are possible. The STI 252 may include a multi-layer structure, for example, having a thermal oxide liner layer and a dielectric fill layer above the thermal oxide liner layer.

The gates TG, RST, SF, and SEL may be provided on the first surface 250a of the substrate 250 to serve as gate electrodes of the transfer transistor T1, the reset transistor T2, the source follower transistor T3, and the select transistor T4, respectively. A gate insulating layer (not shown) may be interposed between the gates TG, RST, SF, and SEL and the substrate 250. A portion of the active region AR directly under the gate functions as a channel region of the respective transistor and two portions of the active region AR on both sides of the channel region function as two source/drain regions of the respective transistor.

The floating diffusion region FD may be provided in the substrate 250 between the gate TG of the transfer transistor T1 and the STI 252. The floating diffusion region FD may be doped to have a different or opposite conductivity type from the well region PW. For example, the floating diffusion region FD may be doped with n-type impurities.

A doped region 256 may be provided in a portion of the active region AR spaced apart from the gate TG of the transfer transistor T1 by the STI 252. The doped region 256 may be doped with the same conductivity type as the well region PW. For example, both the doped region 256 and the well region PW may be doped with p-type impurities.

However, the doped region 256 may be doped with a higher doping concentration than the well region PW in an embodiment.

Contacts C1, C2, C3, C4, C5, C6, C7, and C8, metal wires W1, W2, W3, W4, W5, W6, and W7, inter-layer dielectric layers DL1 and DL2, and a passivation layer PL may be provided on the first surface 250a of the substrate 250. On locations where the contacts C1-8 land, silicide features (not shown) may be formed between the active region AR and the respective contact to reduce contact resistance. The doped region 256 is connected to the contact C1 and the metal wire W1 which are applied with a ground potential therethrough, which effectively grounds the doped region 256. The gate TG is connected to the contact C2 and the metal wire W2 which are applied with a transfer control signal therethrough. The floating diffusion region FD is connected to the contact C3 and the metal wire W3, which is further connected to the gate SF of the source follower transistor T3 through the contact C5 and the metal wire W5. One of the source/drain regions 258 of the source follower transistor T3 that is not shared with the select transistor T4 is connected to the contact C4 and the metal wire W4 which are coupled to a power rail VDD. The gate SEL of the select transistor T4 is connected to the contact C6 and the metal wire W6 which are applied with a select signal therethrough. One of the source/drain regions 258 of the select transistor T4 that is not shared with the source follower transistor T3 is connected to the contact C7 and the metal wire W7 which is coupled to the bit line 110.

A protection layer 260 may be provided on the second surface 250b of the substrate 250. The protection layer 260 may be formed of a metal oxide layer, which may be formed by oxidizing metallic elements, such as hafnium (Hf), zirconium (Zr), aluminum (Al), tantalum (Ta), titanium (Ti), yttrium (Y), and lanthanoids. The protection layer 260 may be configured to have negative fixed charges to effectively reduce a dark current of the image sensor.

Each of the pixels 200 may include a color filter CF and a microlens ML. The color filter CF and the microlens ML may be provided below the protection layer 260. The color filter CF may be a portion of a color filter array including a plurality of color filters arranged in the form of matrix. According to one embodiment, the color filter array may be provided to form a Bayer pattern including a red filter, a green filter, and a blue filter. In another embodiment, the color filter array may be configured to include a yellow filter, a magenta filter, and a cyan filter.

Figure 6:
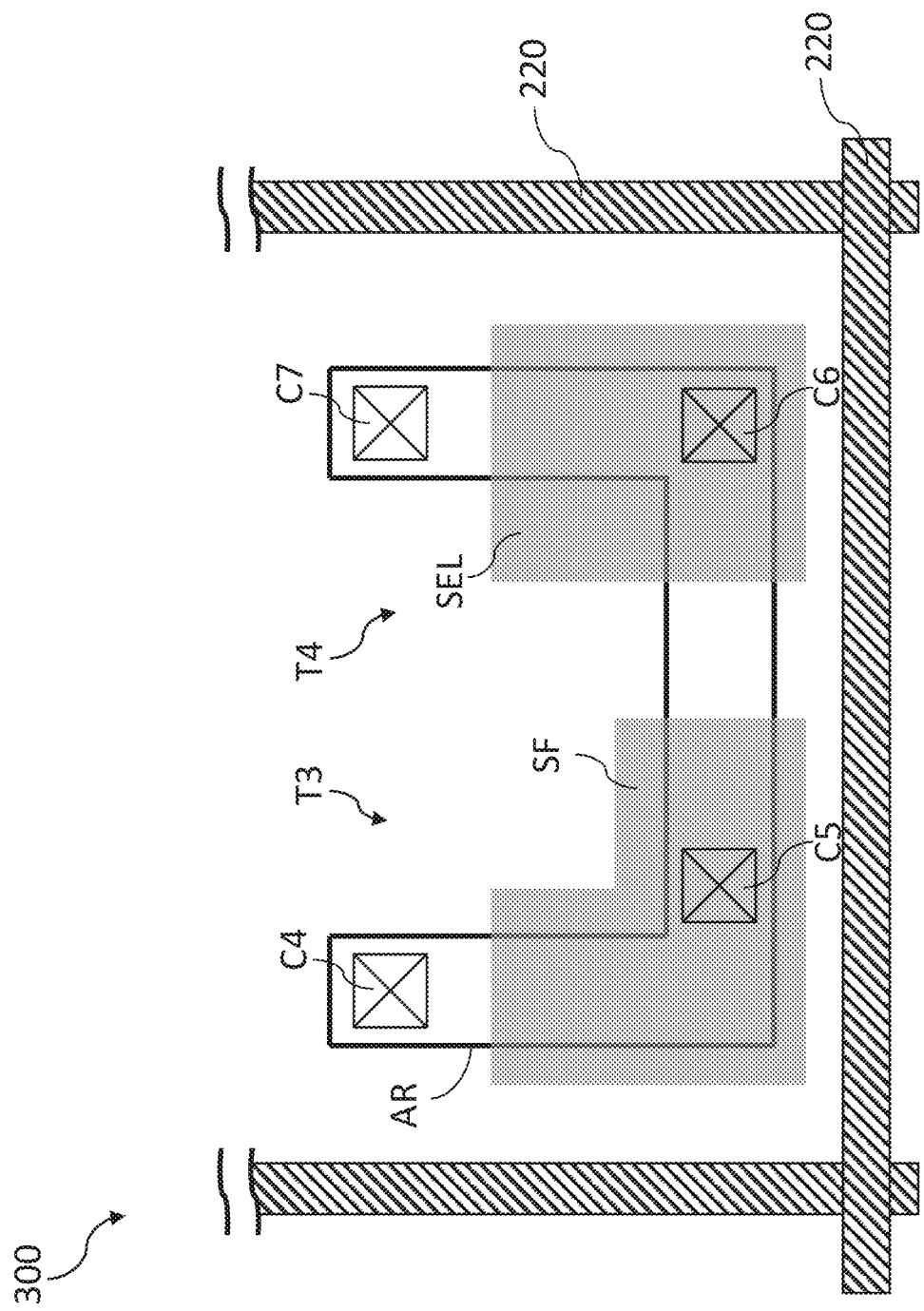
FIG. 6 illustrates an exemplary layout of a source follower transistor and a select transistor (such as a row select transistor) according to various aspects of the present disclosure.

FIG. 6 is an alternative layout of a region 300 of FIG. 4. The region 300 includes parts of the DTI structure 220, the active region AR, the source follower (SF) transistor T3, and the select transistor T4. The transistors T3 and T4 share the same active region AR, but each has its own gate (e.g., poly gate or high-k metal gate). Other components in the pixel 200, such as the photodiode PD and other transistors, are omitted in FIG. 6 for the purpose of simplicity and clarity. One difference between the layout in FIG. 6 and the layout in FIG. 4 is that the active region AR shown in FIG. 6 has a U-shape. Compared with a rectangular shaped active region AR, a U-shaped active region AR makes the effective gate length longer for the transistors, thereby reducing or eliminating short channel effects. This is particularly advantageous as the pixel pitch scales down to around 0.8 µm or smaller.

Figure 7:
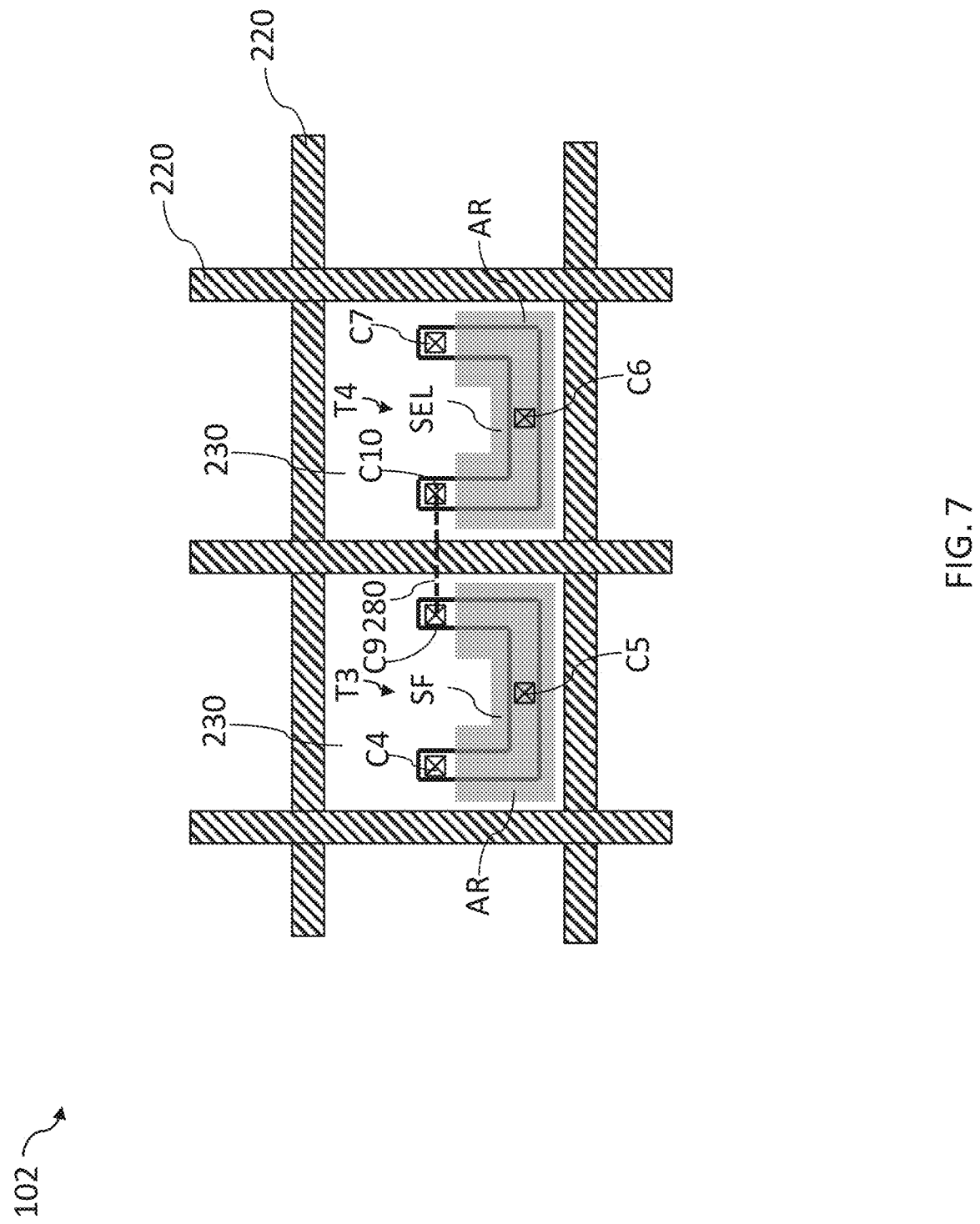
FIGS. 7, 8, 9, 10, 11, and 12 illustrate alternative layouts of a source follower transistor and a select transistor located in separate pixel regions according to various aspects of the present disclosure.
Figure 8:
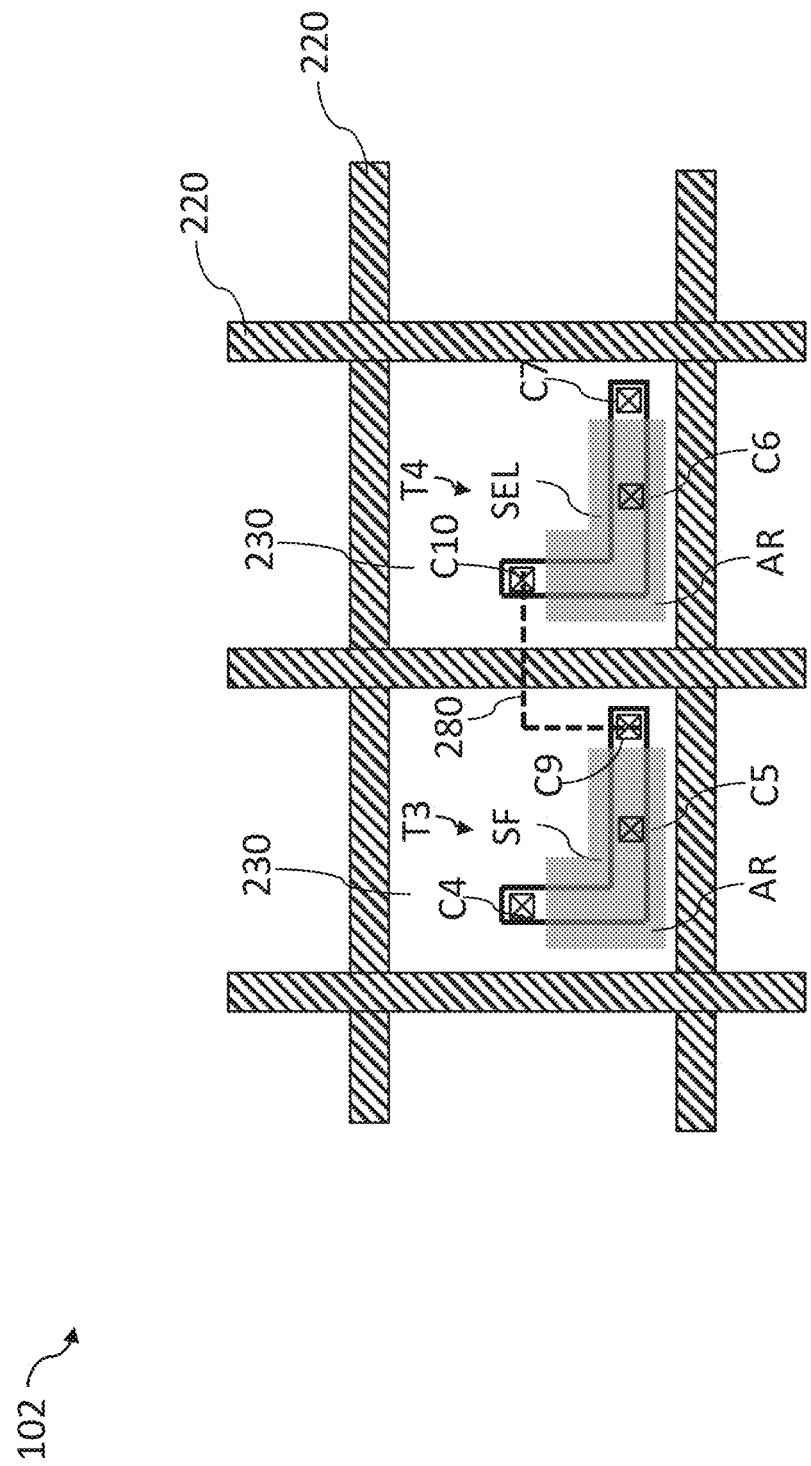

FIG. 7 shows a modified layout in which the source follower transistor T3 and the select transistor T4 of the same grouped pixels 200 are separated into two adjacent pixel regions 230. Other components in the pixel 200, such as the photodiode PD and other transistors, are omitted in FIG. 7 for simplicity and clarity. Without sharing a common source/drain region, extra contacts C9 and C10 and metal wires (represented by dashed line 280) are formed to connect one source/drain region (e.g., the source region) of the source follower transistor T3 to one source/drain region (e.g., the drain region) of the select transistor T4. Silicide features (not shown) may be formed between the source/drain regions and the contacts C9 and C10 to reduce contact resistance. Metal routings may also be optimized to reduce metal routing resistance. Since each of the transistors T3 and T4 has its own active region AR, the effective gate length for each transistor becomes larger than in approaches where both transistors T3 and T4 are packed into a single pixel region 230. With the embodiment depicted in FIG. 7, the pixel pitch may be scaled down into sub-0.8 µm or smaller, and each pixel region still provides enough space for the source follower transistor T3 and the select transistor T4. U-shaped active regions AR (as well as U-shaped gates) are still implemented in the embodiment in FIG. 7 for further increasing effective channel length. Alternatively, active region AR in other shapes, such as an L-shape or a rectangular shape, may be used depending on pixel pitch and layout allocation (e.g., placement of the photodiode PD). FIG. 8 illustrates such an alternative layout where both active regions AR are in an L-shape.

Figure 9:
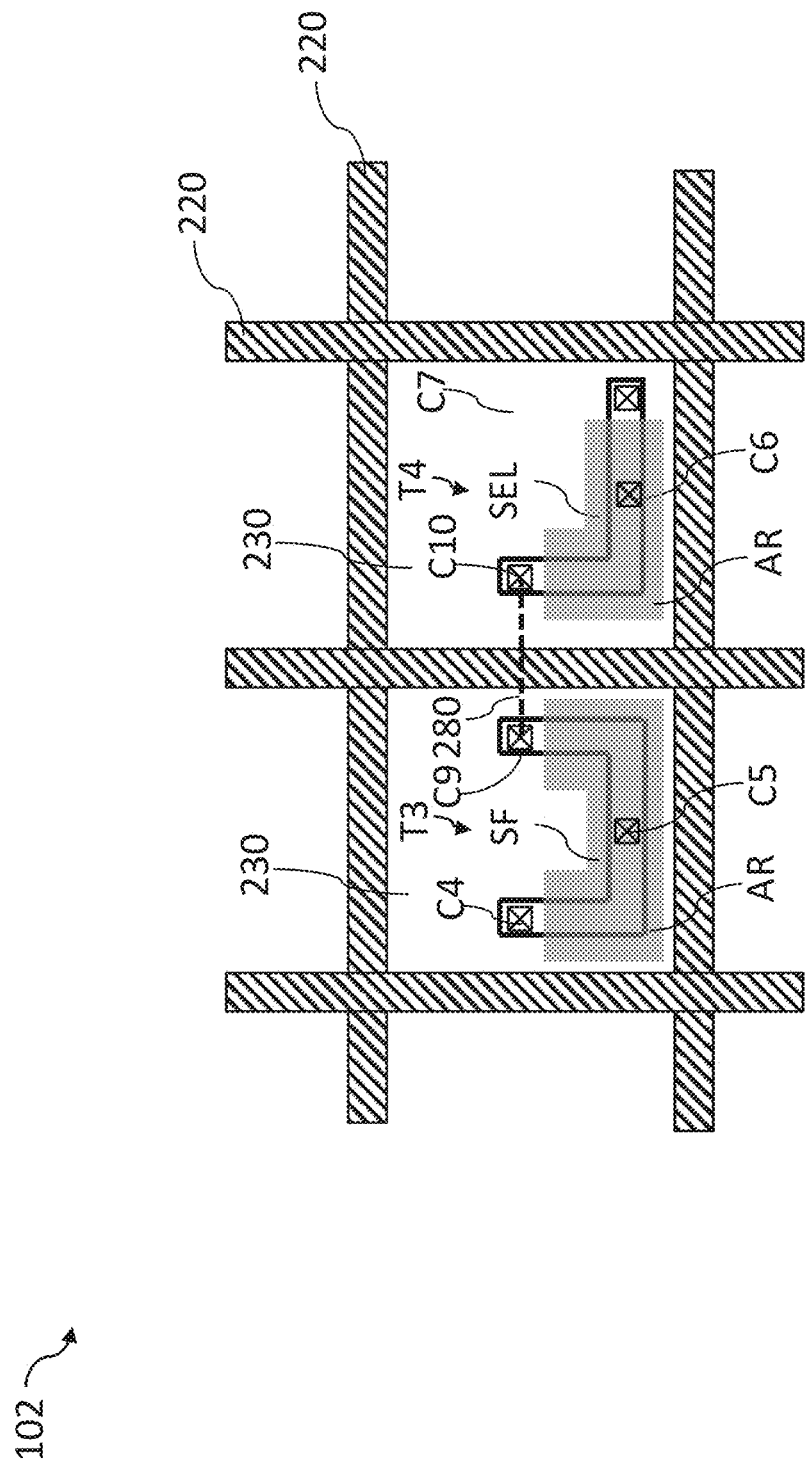

The source follower transistor T3 and the select transistor T4 provide different circuit functions. The source follower transistor T3 amplifies a charge in the electrical potential of the floating diffusion region FD, and the select transistor T4 serves to select pixels arranged in a row which are to be read. Thus, performance requirements for the source follower transistor T3 and the select transistor T4 may be different in some embodiments. For example, the gate oxide thickness of the source follower transistor T3 may be thinner, while the gate length and width of the source follower transistor T3 may be larger. To meet different performance requirements, the active regions AR for the source follower transistor T3 and the select transistor T4 may have different shapes in some embodiments, an example of which is shown in FIG. 9. As depicted in FIG. 9, one pixel region 230 includes a U-shaped active region AR for the source follower transistor T3 and an adjacent pixel region 230 includes an L-shape active region AR for the select transistor T4. Still further, having the source follower transistor T3 and the select transistor T4 in different pixel regions allows manufacturing process parameters to be tuned separately for the two pixel regions. For example, the source follower transistor T3 and the select transistor T4 in FIGS. 7-9 (as well as in FIGS. 10-14) may have different doping concentrations in the source/drain regions, different gate oxide thicknesses, or different other aspects. For example, different doping concentration in the source/drain regions allow for different carrier mobility, different drive strengths, and/or different current conducting capabilities. Further, different gate oxide thicknesses allow for different leakage control and threshold voltage tuning. If the source follower transistor T3 and the select transistor T4 are in the same pixel region, it might be difficult to tune these process parameters differently for the two transistors because they are very close to each other especially when the pixel pitch scales down to 0.8 µm or smaller due to photolithography limitations, dopant diffusion, or other process limitations.

Figure 10:
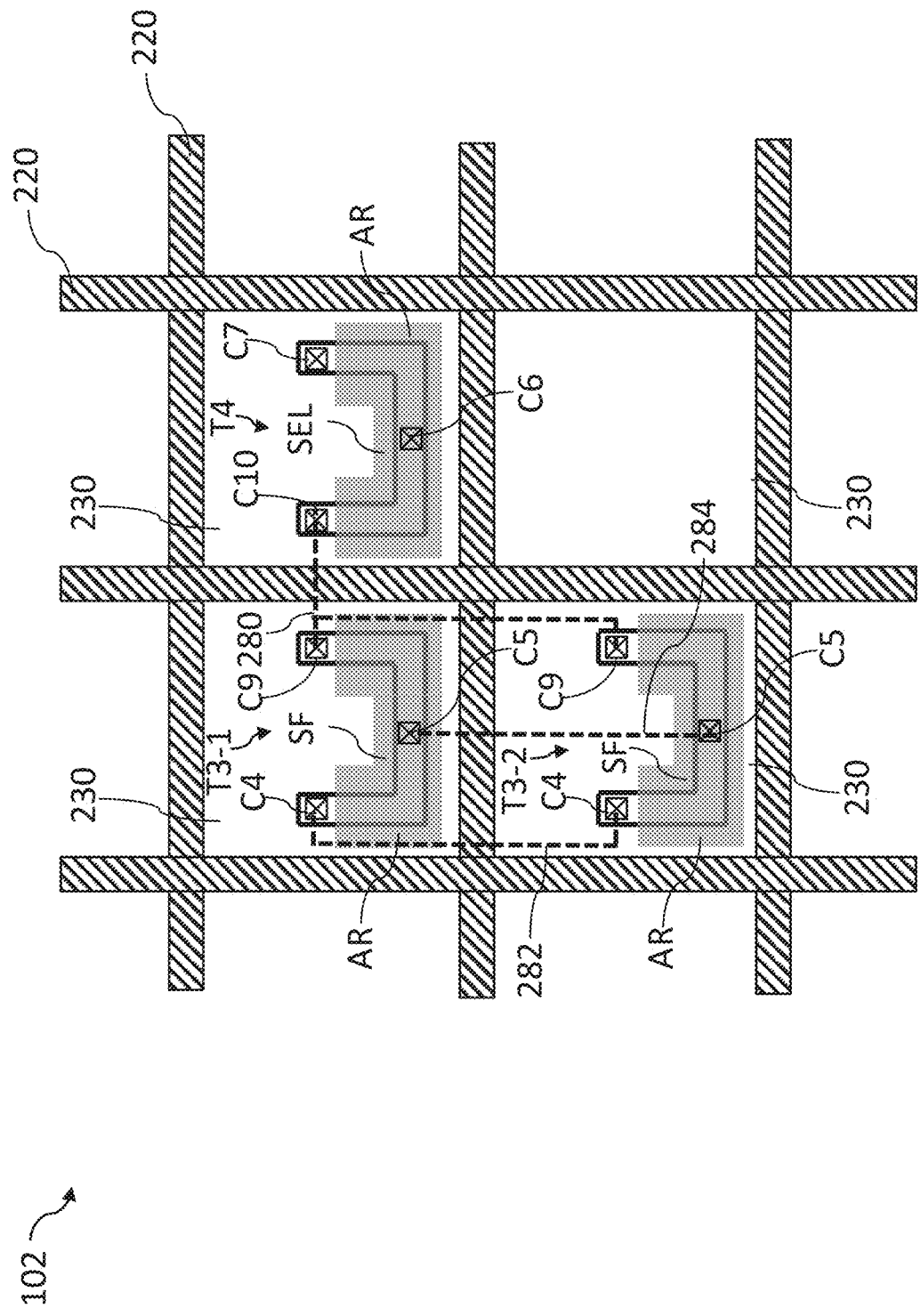

FIG. 10 shows a modified layout in which the select transistor T4 is in a pixel region 230 and the source follower transistor T3 is divided into two other adjacent pixel regions 230 and includes a first sub-transistor T3-1 and a second sub-transistor T3-2. Other components in the pixel 200, such as the photodiode PD and other transistors, are omitted in FIG. 10 for simplicity and clarity. Respective source/drain regions of the first sub-transistor T3-1 and the second sub-transistor T3-2 are connected such that the two sub-transistors are connected in parallel. The connection between the two sub-transistors T3-1 and T3-2 may be at the contact level or at interconnect level(s) above the contact level. For example, the contacts C4 of the first sub-transistor T3-1 and the second sub-transistor T3-2 may be a shared contact or may be connected through metal wires and vias (represented by dotted line 282) above the contacts C4. Similarly, the contacts C9 of the first sub-transistor T3-1 and the second sub-transistor T3-2 may be a shared contact or may be connected through metal wires and vias (represented by dotted line 280) above the contacts C9. Similarly, the contacts C5 of the first sub-transistor T3-1 and the second sub-transistor T3-2 may be a shared contact or may be connected through metal wires and vias (represented by dotted line 284) above the contacts C5. Further, the contacts C9 of the first sub-transistor T3-1 and the second sub-transistor T3-2 are also connected to the contact C10 of the select transistor T4 by using a shared contact or using metal wires and vias above the contacts C9 and C10. By implementing the source follower transistor T3 using two sub-transistors in parallel in two separate pixel regions, the effective gate width of the source follower transistor T3 is increased (for example, doubled), which is wider than what design rules for a single pixel region could allow. A wider gate width of the source follower transistor T3 benefits the pixel 200 with increased drain current and the speed of the circuit. In the illustrated embodiment, the layouts of the active regions AR and the gates SF for the first sub-transistor T3-1 and the second sub-transistor T3-2 are the same. Alternatively, the layouts can be different. In other words, the first sub-transistor T3-1 and the second sub-transistor T3-2 may have different shapes in their active regions AR and/or gates SF and have different gate widths and gate lengths. Further, having the first sub-transistor T3-1 and the second sub-transistor T3-2 in two different pixel regions 40 allows manufacturing process parameters to be tuned separately for the two pixel regions 230. For example, the first sub-transistor T3-1 and the second sub-transistor T3-2 may have different doping concentrations in the source/drain regions, different gate oxide thicknesses, and/or other differences to fit different performance requirements.

Figure 11:
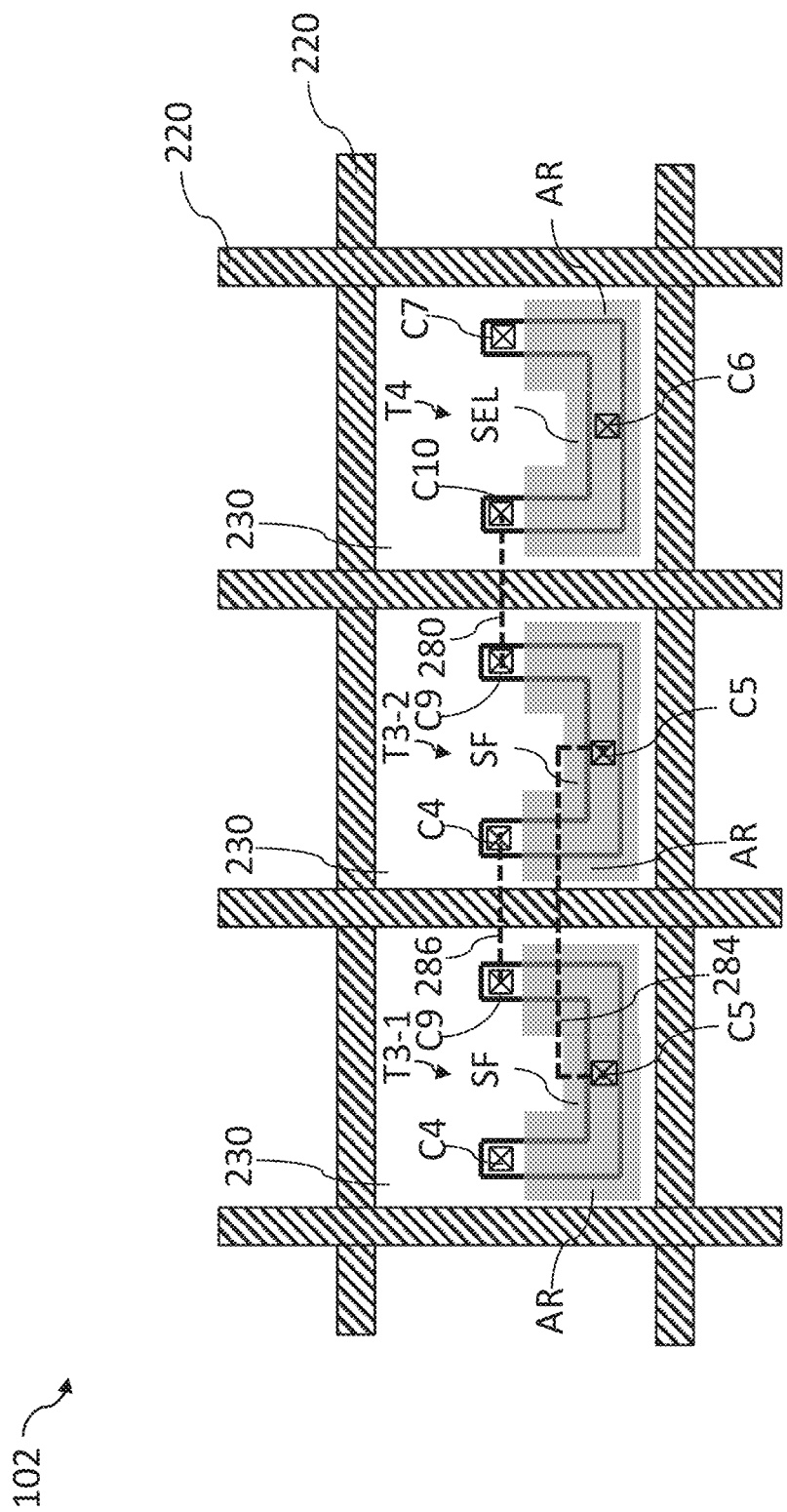

FIG. 11 shows another modified layout in which the select transistor T4 is in a pixel region and the source follower transistor T3 is divided into two other pixel regions 230 and includes a first sub-transistor T3-1 and a second sub-transistor T3-2 that are connected in series. Other components in the pixel 200, such as the photodiode PD and other transistors, are omitted in FIG. 11 for simplicity and clarity. In the depicted embodiment, the source/drain regions of the first sub-transistor T3-1 and the second sub-transistor T3-2 are connected in series. For example, the contact C4 of the first sub-transistor T3-1 may be connected to a power rail VDD through metal wires and vias (not shown), the contact C9 of the first sub-transistor T3-1 and the contact C4 of the second sub-transistor T3-2 may be a shared contact or may be connected through metal wires and vias (represented by dotted line 286) above the contacts C4 and C9, t and the contacts C5 of the first sub-transistor T3-1 and the second sub-transistor T3-2 may be a shared contact or may be connected through metal wires and vias (represented by dotted line 284) above the contacts C5. Further, the contact C9 of the second sub-transistor T3-2 and the contact C10 of the select transistor T4 may be a shared contact or may be connected through metal wires and vias (represented by dotted line 280) above the contacts C9 and C10. By implementing the source follower transistor T3 using two sub-transistors in two separate pixel regions 230 and connected in series, the effective gate length of the source follower transistor T3 is increased (for example, doubled), which is longer than what design rules for a single pixel region could allow. A longer gate length of the source follower transistor T3 benefits the pixel 200 with increased gain and better noise immunity. In the illustrated embodiment, the layouts of the active regions AR and the gates SF for the first sub-transistor T3-1 and the second sub-transistor T3-2 are the same. Alternatively, the layouts can be different. In other words, the first sub-transistor T3-1 and the second sub-transistor T3-2 may have different shapes in their active regions AR and/or gates SF and have different gate widths and gate lengths. Further, having the first sub-transistor T3-1 and the second sub-transistor T3-2 in two different pixel regions allows manufacturing process parameters to be tuned separately for the two pixel regions 230. For example, the first sub-transistor T3-1 and the second sub-transistor T3-2 may have different doping concentrations in the source/drain regions, different gate oxide thicknesses, and/or other differences to fit different performance requirements.

Figure 12:
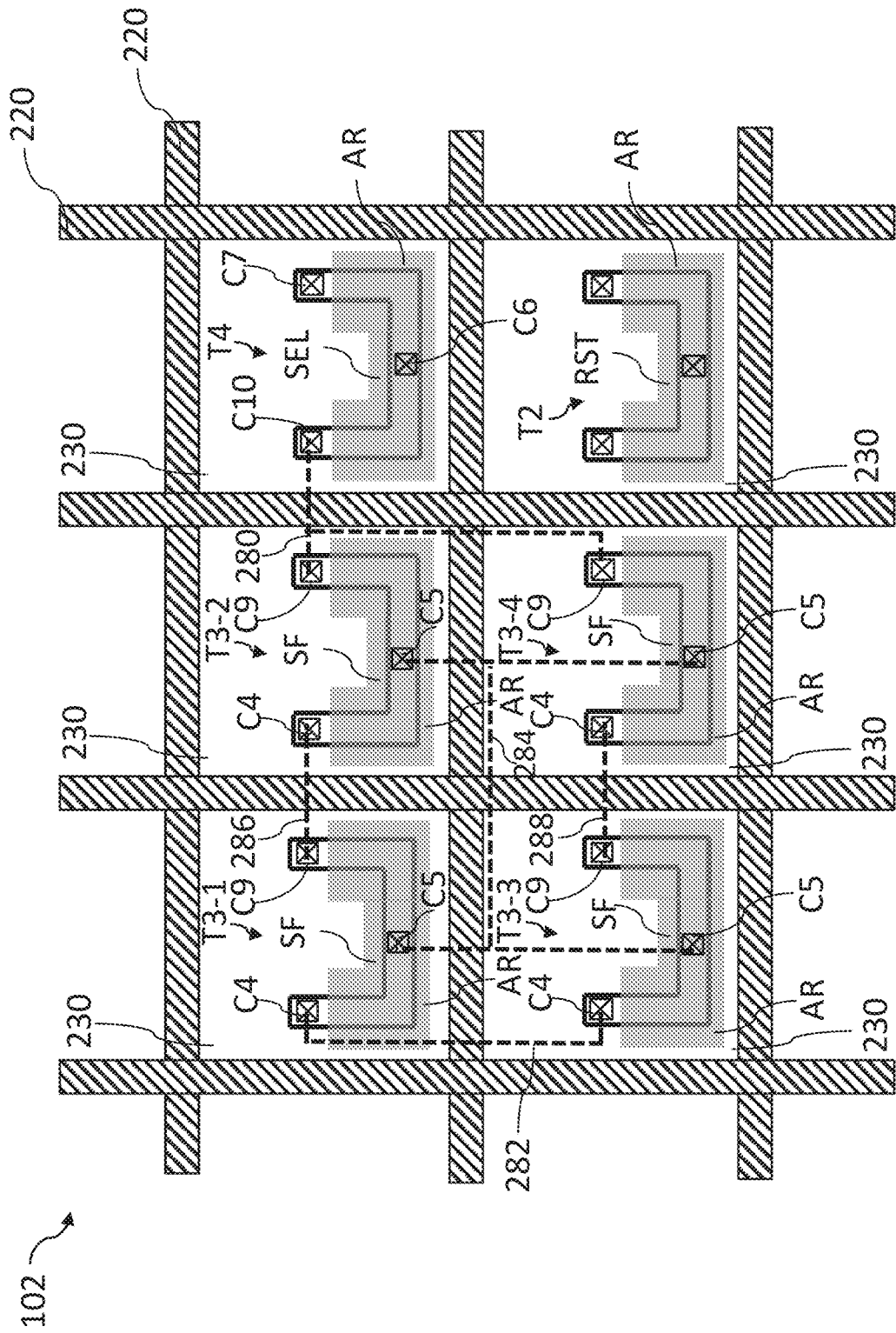

FIG. 12 shows another modified layout in which the select transistor T4 is in a pixel region and the source follower transistor T3 is divided into four other pixel regions 230 and includes a first sub-transistor T3-1, a second sub-transistor T3-2, a third sub-transistor T3-3, and a fourth sub-transistor T3-4. Other components in the pixel 200, such as the photodiode PD and other transistors, are omitted in FIG. 12 for simplicity and clarity. The source/drain regions of the sub-transistors T3-1, T3-2, T3-3, and T3-4 are connected in a way such that the sub-transistors T3-1 and T3-2 are connected in series, the sub-transistors T3-3 and T3-4 are connected in series, and the sub-transistors T3-1 and T3-2 are further connected with the sub-transistors T3-3 and T3-4 in parallel. For example, the contacts C4 of the first sub-transistor T3-1 and the third sub-transistor T3-3 may be a shared contact or may be connected through metal wires and via (represented by dotted line 282) above the contacts C4. The contact C9 of the first sub-transistor T3-1 and the contact C4 of the second sub-transistor T3-2 may be a shared contact or may be connected through metal wires and vias (represented by dotted line 286) above the respective contacts. The contact C9 of the third sub-transistor T3-3 and the contact C4 of the fourth sub-transistor T3-4 may be a shared contact or may be connected through metal wires and vias (represented by dotted line 288) above the respective contacts. The contact C9 of the second sub-transistor T3-2, the contact C9 of the fourth sub-transistor T3-4, and the contact C10 of the select transistor T4 may be a shared contact or may be connected through metal wires and via (represented by dotted line 280) above the respective contacts. The contacts C5 of the sub-transistor T3-1, T3-2, T3-3, and T3-4 may be a shared contact or may be connected through metal wires and vias (represented by dotted line 284) above the respective contacts. By implementing the source follower transistor T3 using four sub-transistors in four separate pixel regions 230 and connecting the four sub-transistors as described above, the effective gate length and gate width of the source follower transistor T3 are increased, which is longer and wider than what design rules for a single pixel region could allow. A longer gate length and a wider gate width of the source follower transistor T3 benefit the pixel 200 with increased gain, better noise immunity, increased drain current, and increased speed of the circuit. In the illustrated embodiment, the layouts of the active regions AR and the gates SF for the four sub-transistors T3-1, T3-2, T3-3, and T3-4 are the same. Alternatively, the layouts can be different. In other words, the four sub-transistors T3-1, T3-2, T3-3, and T3-4 may have different shapes in their respective active regions AR and/or gates SF and have different gate widths and gate lengths. Further, having the four sub-transistors T3-1, T3-2, T3-3, and T3-4 in four different pixel regions 230 allows manufacturing process parameters to be tuned separately for the four pixel regions 230. For example, the four sub-transistors T3-1, T3-2, T3-3, and T3-4 may have different doping concentrations in the source/drain regions, different gate oxide thicknesses, and/or other differences to fit different performance requirements.

Figure 13:
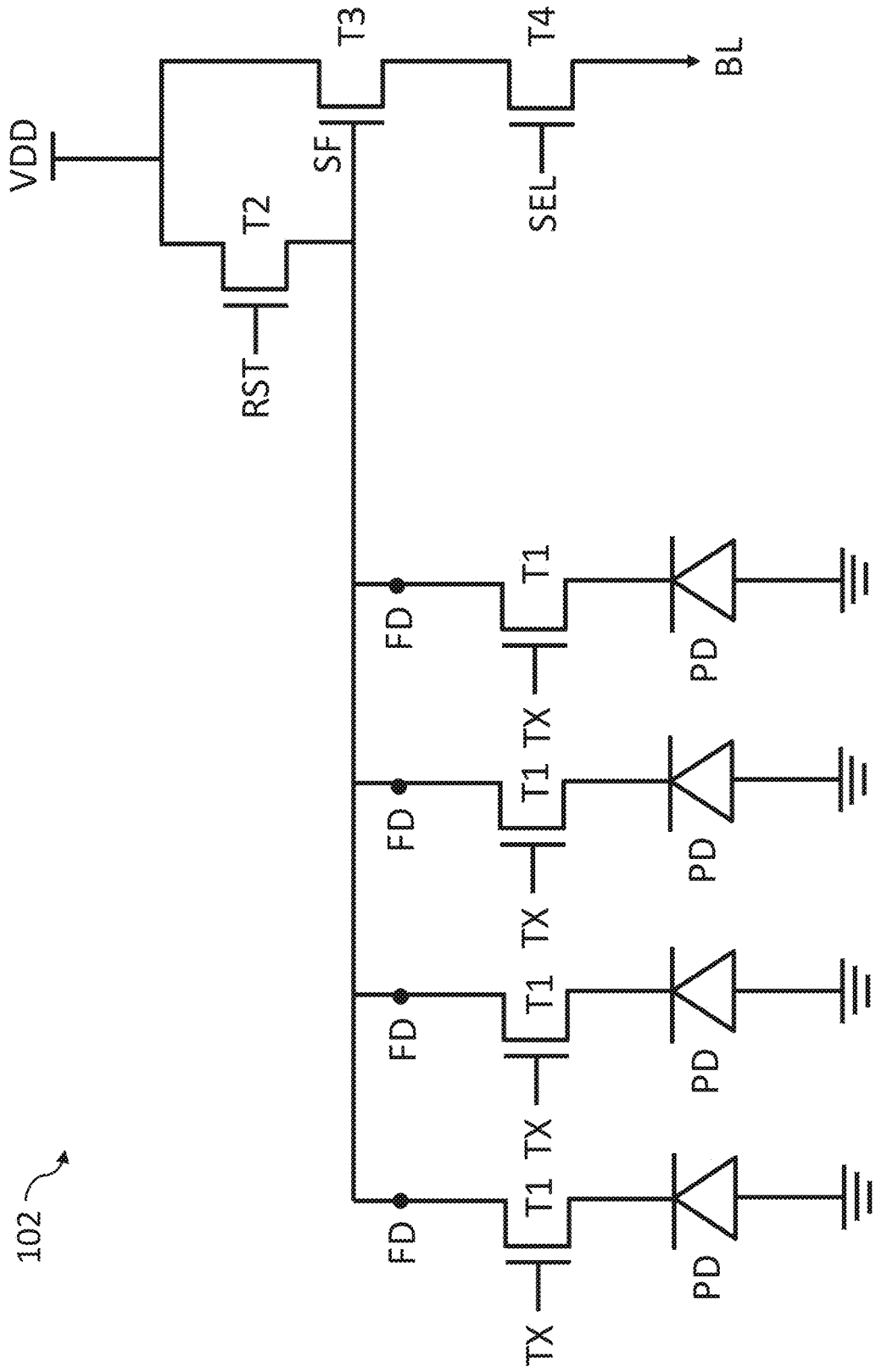
FIG. 13 is a schematic illustrating a pixel that includes multiple photodiodes sharing, a reset transistor, a source follower transistor, and a select transistor according to various aspects of the present disclosure
Figure 14:
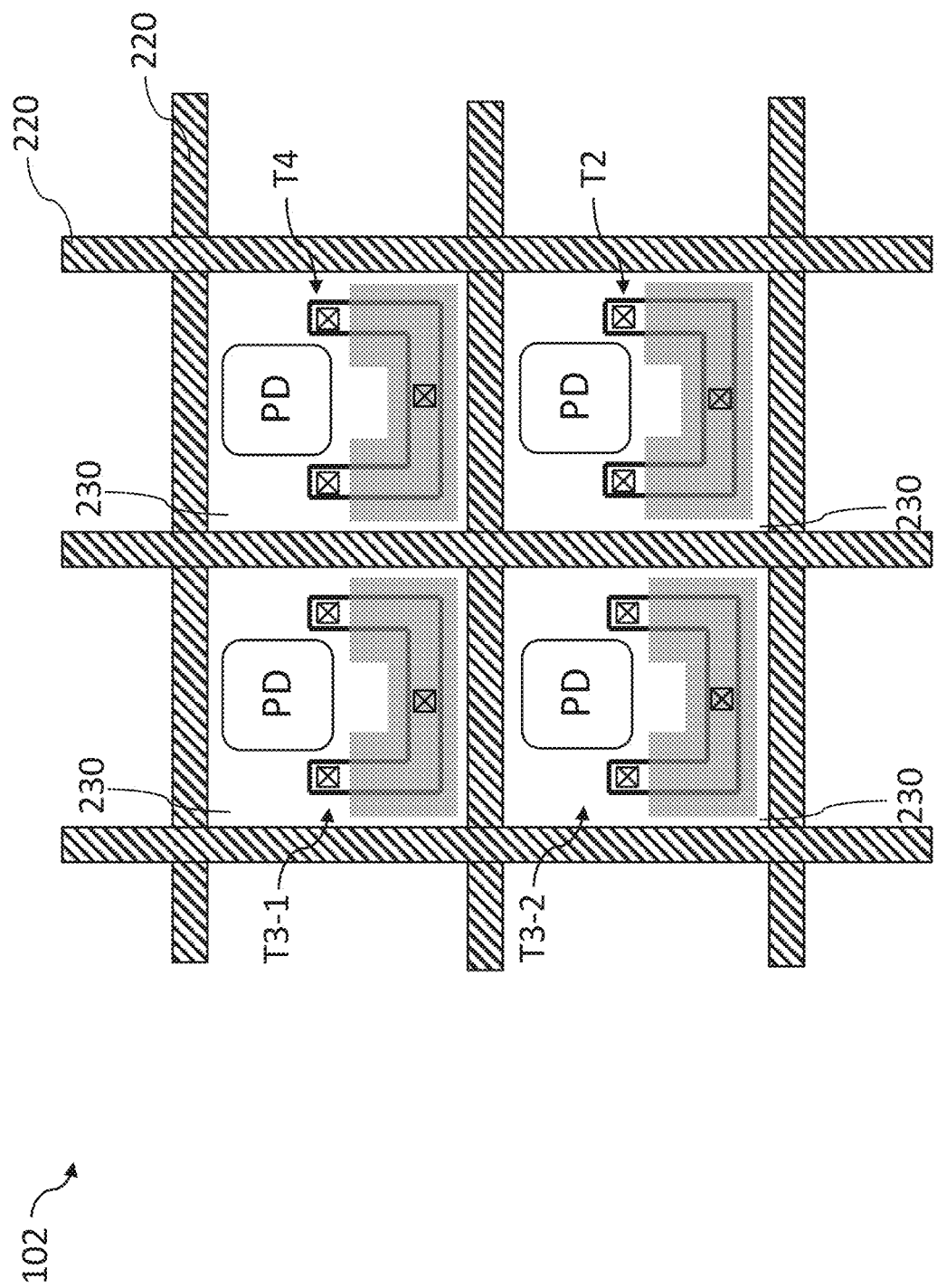
FIG. 14 is a top view of an exemplary layout of the pixel as shown in FIG. 13 according to various aspects of the present disclosure.

In an embodiment, the source follower transistors T3 (including sub-transistors) and the select transistor T4 are allocated in multiple pixel regions 230, such as shown in FIGS. 7-12, but may be associated with a single photodiode PD. For example, the photodiode PD may be allocated in one of the pixel regions 230 where part of the source follower transistor T3 also resides. In an alternative embodiment as illustrated in FIGS. 13 and 14, each pixel region 230 may include one photodiode PD, which has its own transfer transistor and floating diffusion region FD respectively, and the multiple photodiodes PD share the same set of the source follower transistor T3 and the select transistor T4. It should be noted that in FIG. 13, the floating diffusion regions FD are electrically connected as a common node, while the transfer transistors T1 on the other hand, are controlled separately. Other transistors, such as the reset transistor T2, may also reside in their own pixel regions and shared by the multiple photodiodes PD. Referring to FIG. 13, the image sensor 102 includes groups of four photodiodes PD that share the reset transistor T2, the source follower transistor T3, and the select transistor T4. Referring to FIG. 14, the source follower transistor T3, the select transistor T4, and the reset transistor T2 reside in different pixel regions 230 separated by the walls of the DTI structure 220. Each pixel region 230 includes one photodiode PD that shares the pixel region 230 with a respective transistor. In the illustrated embodiment, the source follower transistor T3 further includes a first sub-transistor T3-1 and a second sub-transistor T3-2 residing in two separate pixel regions 230. The first sub-transistor T3-1 and the second sub-transistor T3-2 may be connected in parallel or in series as discussed above. Other components in pixels and metal routings are omitted in FIG. 14 for simplicity and clarity. Referring to FIG. 12, similarly, the reset transistor T2 may be allocated in a separate pixel region 230, such as in the lower-right corner, and each of the pixel regions 230 includes a photodiode PD. In other words, four photodiodes PD may share the set of the source follower transistor T3 (including four sub-transistors in FIG. 12), the select transistor T4, and the reset transistor T2. As discussed above, transistors in different pixel regions may have different layout, such as having different shapes in their active regions AR and gates and may be tuned with different manufacturing process parameters, such as doping concentrations and/or gate oxide thicknesses.

Although not intended to be limiting, one or more embodiments of the present disclosure provide many benefits to an imaging system (such as a fingerprint recognition system in a portable electronic device). For example, sensing signals are enhanced with lower cross-talk and less noise interferences by confining components of pixels of an image sensor in cells defined by a DTI structure. By allocating transistors in multiple cells, more flexible design choices and process parameters can be fine-tuned for each transistor. Further, the disclosed methods can be easily integrated into existing semiconductor manufacturing processes.

In one exemplary aspect, the present disclosure is directed to an image sensor device. The image sensor device includes a substrate having a plurality of pixel regions, a first photodiode in a first pixel region, a source follower transistor coupled to the first photodiode, and a select transistor coupled to the source follower transistor. In an embodiment, the plurality of pixel regions are defined by a deep trench isolation (DTI) structure, such as BDTI (back-side DTI) and FDTI (front-side DTI, or referred to as full-depth DTI), while in some other embodiments, the plurality of pixel regions may be defined by other isolation structures. The present disclosure is not limited thereto. One of the source follower transistor and the select transistor is in a second pixel region of the plurality of pixel regions which is different from the first pixel region. In some embodiments, the first and second pixel regions are adjacent to each other. In some embodiments, the source follower transistor includes two sub transistors in two adjacent pixel regions of the plurality of pixel regions, and one of the two adjacent pixel regions is the first pixel region. In some embodiments, the two sub transistors are connected in series. In some embodiments, the two sub transistors are connected in parallel. In some embodiments, the source follower transistor includes four sub transistors in four adjacent pixel regions of the plurality of pixel regions, and one of the four adjacent pixel regions is the first pixel region. In some embodiments, the four sub transistors include first and second sub transistors connected in series and third and fourth sub transistors connected in series, and the first and second sub transistors are connected in parallel with the third and fourth sub transistors. In some embodiments, the source follower transistor and the select transistor have at least one process parameter different from each other, and the process parameter is selected from doping concentration in source/drain regions and gate oxide thicknesses. In some embodiments, the image sensor device further includes a second photodiode in the second pixel region. The first and second photodiodes share the source follower transistor and the select transistor. In some embodiments, the source region of the source follower transistor and the drain region of the select transistor are connected by contacts and metal wires, like contact-wire-contact. In some embodiments, the plurality of pixel regions form a two-dimensional array, and each of the plurality of pixel regions has a unit size.

In another exemplary aspect, the present disclosure is directed to an image sensor device. The image sensor device includes a plurality of photodiodes formed in a semiconductor substrate. Each photodiode is configured to accumulate photo charges corresponding to an intensity of light received at each photodiode. The pixel also includes a plurality of trenches formed in the semiconductor substrate and configured to define a plurality of cells. The cells electrically isolate the photodiodes one from another. The image sensor device also includes a first transistor with a first gate coupled to the accumulated photo charges and a second transistor. A first source/drain region of the first transistor is connected to a second source/drain region of the second transistor, and the first transistor and the second transistor are in different cells. In some embodiments, the first transistor is a source follower transistor, and the second transistor is a select transistor. In some embodiments, the first transistor includes a plurality of sub transistors in multiple cells. In some embodiments, the first gate has a U-shape. In some embodiments, the first source/drain region and the second source/drain region have different doping concentrations. In some embodiments, the trenches extend completely through the semiconductor substrate. In some embodiments, the image sensor device further includes a third transistor operable to discharge the accumulated photo charges. The third transistor is in a cell different from where the first and second transistors reside.

In yet another exemplary aspect, the present disclosure is directed to a semiconductor structure. The semiconductor structure includes a semiconductor substrate that has a first surface and a second surface facing each other, and a deep trench isolation (DTI) structure extending from the first surface to the second surface for defining cells isolated from each other. The semiconductor structure also includes a photoelectric element formed in a first one of the cells, the photoelectric element being configured to receive a light incident at the first surface of the semiconductor substrate, a source follower transistor formed on the second surface of the semiconductor substrate, the source follower transistor sharing the first cell with the photoelectric element, and a select transistor formed on the second surface of the semiconductor substrate, the select transistor being in a second one of the cells different from the first cell. In some embodiments, the semiconductor structure further includes a reset transistor formed on the second surface of the semiconductor substrate, the reset transistor being in a third cell different from the first one and the second one of the cells. In some embodiments, the semiconductor structure further includes a transfer transistor formed on the second surface of the semiconductor substrate, the transfer transistor sharing the first one of the cells with the photoelectric element. In some embodiments, the cells have unit size.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
   a substrate;
   a plurality of trenches formed in the substrate to define a plurality of pixel regions;
   a first photodiode in a first pixel region of the plurality of pixel regions;
   a source follower transistor electrically coupled to the first photodiode; and
   a select transistor electrically coupled to the source follower transistor and configured to control an electrical connection between an output of the source follower transistor and a bit line associated with the first photodiode, wherein one of the source follower transistor and the select transistor is in a second pixel region of the plurality of pixel regions which is different from the first pixel region, while another one of the source follower transistor and the select transistor is in the first pixel region,
   wherein at least one of the source follower transistor and the select transistor includes a gate that has a continuous U-shape completely within a boundary of one of the first pixel region or the second pixel region in a plan view of the image sensor device.

2. The image sensor device of claim 1, wherein the first and second pixel regions are adjacent to each other.

3. The image sensor device of claim 1, wherein the source follower transistor includes two sub transistors in two adjacent pixel regions of the plurality of pixel regions, and wherein one of the two adjacent pixel regions is the first pixel region.

4. The image sensor device of claim 3, wherein the two sub transistors are connected in series.

5. The image sensor device of claim 3, wherein the two sub transistors are connected in parallel.

6. The image sensor device of claim 1, wherein the source follower transistor includes four sub transistors in four adjacent pixel regions of the plurality of pixel regions, and wherein one of the four adjacent pixel regions is the first pixel region.

7. The image sensor device of claim 6, wherein the four sub transistors include first and second sub transistors connected in series and third and fourth sub transistors connected in series, and wherein the first and second sub transistors are connected in parallel with the third and fourth sub transistors.

8. The image sensor device of claim 1, wherein the source follower transistor and the select transistor have different gate oxide thicknesses.

9. The image sensor device of claim 1, further comprising:
   a second photodiode in the second pixel region, wherein the first and the second photodiodes share the source follower transistor and the select transistor.

10. The image sensor device of claim 1, wherein the source follower transistor includes a first gate that has the continuous U-shape in the plan view of the image sensor device, and the select transistor includes a second gate that has another continuous U-shape in the plan view of the image sensor device.

11. The image sensor device of claim 1, wherein the gate of the source follower transistor or the select transistor is completely within a boundary of either the first pixel region or the second pixel region without extending beyond the boundary.

12. An image sensor device, comprising:
   a plurality of photodiodes formed in a semiconductor substrate, wherein each photodiode is configured to accumulate photo charges corresponding to an intensity of light received at each photodiode;
   a plurality of trenches formed in the semiconductor substrate and configured to define a plurality of cells, wherein the cells electrically isolate the photodiodes one from another;
   a first transistor with a first gate coupled to the accumulated photo charges; and
   a second transistor with a second gate, wherein a first source/drain region of the first transistor is electrically connected to a second source/drain region of the second transistor through a first source/drain contact physically landing on the first source/drain region, a second source/drain contact physically landing on the second source/drain region, and a metal wiring feature physically connecting the first source/drain contact and the second source/drain contact, wherein the first transistor and the second transistor are in different cells, wherein the metal wiring feature extends across a boundary between the different cells in a plan view of the image sensor device, and wherein the first gate or the second gate has a continuous U-shape completely within the boundary of one of the different cells in the plan view of the image sensor device.

13. The image sensor device of claim 12, wherein the first transistor is a source follower transistor, and the second transistor is a select transistor.

14. The image sensor device of claim 12, wherein the first transistor includes a plurality of sub transistors located in multiple cells.

15. The image sensor device of claim 12, wherein the first source/drain region and the second source/drain region have different doping concentrations.

16. The image sensor device of claim 12, wherein the trenches extend completely through the semiconductor substrate.

17. The image sensor device of claim 12, further comprising:
a third transistor operable to discharge the accumulated photo charges, wherein the third transistor is in a cell different from where the first and second transistors reside.

18. The image sensor device of claim 12, wherein the first transistor includes a first channel region, the first source/drain region and the first channel region are different portions of a first active region, and the first active region has another continuous U-shape in the plan view of the image sensor device with a constant width in the different portions.

19. A semiconductor structure, comprising:
a semiconductor substrate having a first surface and a second surface facing each other;
a deep trench isolation (DTI) structure extending from the first surface to the second surface and defining cells isolated from each other;
a photoelectric element formed in a first one of the cells, the photoelectric element being configured to receive a light incident at the first surface of the semiconductor substrate;
a source follower transistor formed on the second surface of the semiconductor substrate, the source follower transistor sharing the first one of the cells with the photoelectric element; and
a select transistor formed on the second surface of the semiconductor substrate, the select transistor being in a second one of the cells different from the first one of the cells, the select transistor configured to control an electrical connection between an output of the source follower transistor and a bit line associated with the photoelectric element; and
a dielectric layer disposed on a first gate of the source follower transistor and a second gate of the select transistor,
wherein at least one of the first gate and the second gate has an outer surface fully surrounded by and in physical contact with the dielectric layer such that the outer surface in its entirety is completely within a boundary of one of the first one and the second one of the cells in a plan view of the semiconductor structure and has a continuous U-shape in the plan view of the semiconductor structure.

20. The semiconductor structure of claim 19, further comprising:
a reset transistor formed on the second surface of the semiconductor substrate, the reset transistor being in a third one of the cells different from the first one and the second one of the cells.

21. The semiconductor structure of claim 19, further comprising:
a transfer transistor formed on the second surface of the semiconductor substrate, the transfer transistor sharing the first one of the cells with the photoelectric element.

22. The semiconductor structure of claim 19, wherein the second one of the cells includes a single transistor that is the select transistor.

23. The semiconductor structure of claim 19, wherein the at least one of the first gate and the second gate belongs to the source follower transistor.

24. The semiconductor structure of claim 19, wherein the first one of the cells and the second one of the cells are adjacent, and wherein the second one of the cells does not include a second photoelectric element.

* * * * *